United States Patent [19]

Ueno et al.

[11] Patent Number: 4,835,590
[45] Date of Patent: May 30, 1989

[54] SEMICONDUCTOR MEMORY DEVICE USING JUNCTION SHORT TYPE PROGRAMMABLE ELEMENT

[75] Inventors: Kouji Ueno, Inagi; Takamitsu Naito, Yokohama; Yoshitaka Nakajima, Kawasaki, all of Japan

[73] Assignees: Fujitsu Limited, Kanagawa; Fujitsu VLSI Limited, Aichi, both of Japan

[21] Appl. No.: 24,220

[22] Filed: Mar. 10, 1987

[30] Foreign Application Priority Data

Mar. 11, 1986 [JP] Japan .................................. 61-053201

[51] Int. Cl.[4] ............................................ H01L 27/02
[52] U.S. Cl. ........................................ 357/51; 365/96; 365/103; 357/13
[58] Field of Search ....................... 365/96, 103–105; 357/34, 51, 13

[56] References Cited

U.S. PATENT DOCUMENTS 4,388,703  6/1983  Patch ................................... 365/105
4,701,780 10/1987 Hankins et al. ........................ 357/51
4,748,490  5/1988  Hollingsworth ...................... 357/51

FOREIGN PATENT DOCUMENTS

B-324 421  1/1970  Austria .
A1-0 045 447  8/1980  European Pat. Off. .
A1-0 037 930 10/1981 European Pat. Off. .
A2-0-151-354 8/1985 European Pat. Off. .

Primary Examiner—Andrew J. James
Assistant Examiner—Mark Prenty
Attorney, Agent, or Firm—Armstrong, Nikaido, Marmelstein & Kubovcik

[57] ABSTRACT

A semiconductor memory device using a junction short type programmable element comprises an epitaxial layer formed on a semiconductor substrate, the epitaxial layer having an opposite conductive type to that of the semiconductor substrate, the epitaxial layer being a collector region; a base region having the same conductive type as the substrate formed in the epitaxial layer; a first emitter region having an opposite conductive type to that of the base region, formed in the base region; an insulating isolation region, formed in said epitaxial layer and around the base region; a second emitter region having a higher impurity concentration than that of the first emitter region and the same conductive type as the of the first emitter region, formed in the first emitter region in such a manner that the second emitter region penetrate the first emitter region upward and downward and extends to the interior of the base region (14) so that a writing current flows concentratedly at the second emitter region.

12 Claims, 9 Drawing Sheets

SEMICONDUCTOR MEMORY DEVICE USING JUNCTION SHORT TYPE PROGRAMMABLE ELEMENT

BACKGROUND OF THE INVENTION

1. Field of the Invention

The present invention relates to a semiconductor memory device using a junction short type programmable element.

2. Description of the Related Art

When information is written in a junction short-type programmable element, an electric current with a directional property is provided to destroy a junction at an edge portion of cells of the memory device.

The writing of information is carried out by flowing a reverse current from an emitter region to a base region and breaking the emitter-base junction to form a pn junction diode. Namely, writing of the information is carried out by flowing the reverse current near the collector electrode region.

Conventionally, a mask different from a mask used to form an insulating isolation layer is used to form an emitter diffusion region in an epitaxial layer.

The insulating isolation layer is usually formed in a V-shaped region. Since the shape of the insulation layer has a so-called bird's beak shape at both top end sides, the impurity diffusion control becomes difficult when forming a base region using the insulation layer in the V-shaped region as a mask, so that the width of the base region is sometimes smaller. When an emitter region is formed in the base region by using another mask which has a narrower window than area surrounded by the V-shaped isolation layer, the width of the base region also sometimes becomes smaller due to the mask alignment error. Thus, a short (over programming) occurs between the emitter region and the collector region and a normal writing of information in which only Emitter-Base junction is broken can not be carried out.

SUMMARY OF THE INVENTION

It is an object of the present invention to provide a semiconductor memory device using a junction short type programmable element wherein normal writing can be carried out.

It is another object of the present invention to provide a semiconductor memory device using a junction short type programmable element wherein the memory cell area can be reduced.

According to the present invention there is provided a semiconductor memory device using a junction short type programmable element comprising: an epitaxial layer formed on a semiconductor substrate and having an opposite conductive type to that of the semiconductor substrate, the epitaxial layer being a collector region, a base region having the same conductive type as the substrate formed in the epitaxial layer, a first emitter region having an opposite type to that of the base region, formed in the base region, an insulating isolation region formed is the epitaxial layer and around the base region, a second emitter region having a higher impurity concentration than that of the first emitter region and the same conductive type as that of the first emitter region, formed at the bottom portion of the first emitter region in such a manner that the second emitter region extends to the interior of the base region so that a write current flows concentratedly at the second emitter region.

Accoridng to the present invention there is further provided a semiconductor memory device using a junction short type programmable element comprising: an epitaxial layer formed on a semiconductor substrate, and having an opposite conductive type to that of the semiconductor substrate, the epitaxial layer being a collector region, a first base region having the same conductive type formed in the epitaxial layer, an emitter region (15) having an opposite type to that of the base region, formed in the base region, an insulating isolation region, formed in the epitaxial layer and around the base region, a second base region having a higher impurity concentration than that of the first base region and having the same conductive type as that of the first base region, formed at the bottom portion of the first base region in such a manner that the second base region extends to the interior of the epitaxial layer.

According to the present invention there is still further provided a semiconductor memory device using a junction short type programmable element comprising: an epitaxial layer formed on a semiconductor substrate and having an opposite conductive type to that of the semiconductor substrate, the epitaxial layer being a collector region, a first base region having the same conductive type as the substrate formed in the epitaxial layer, an first emitter region having an opposite type to that of the base region, formed in the first base region, an insulating isolation region formed in the epitaxial layer and around the first base region, a second base region having a higher impurity concentration than that of the first base region and having the same conductive type as that of the first emitter region, formed at the bottom portion of the first base region in such a manner that the second base region extends to the interior of the epitaxial layer, a second emitter region having a higher impurity concentration than that of the first emitter region and having the same conductive type as that of the first emitter region, formed in the first emitter region in such a manner that the second emitter region extends to the interior of the second base region so that a writing current flows concentratedly at the second emitter region.

BRIEF DESCRIPTION OF THE DRAWINGS

FIG. 4E is a plan view according to FIG. 4, i.e., FIG. 4D is a cross-sectional view taken along the line II—II of FIG. 4E;

DESCRIPTION OF THE PREFERRED EMBODIMENTS

Before describing the present invention, the related art will be explained in detail.

Figure 1A:
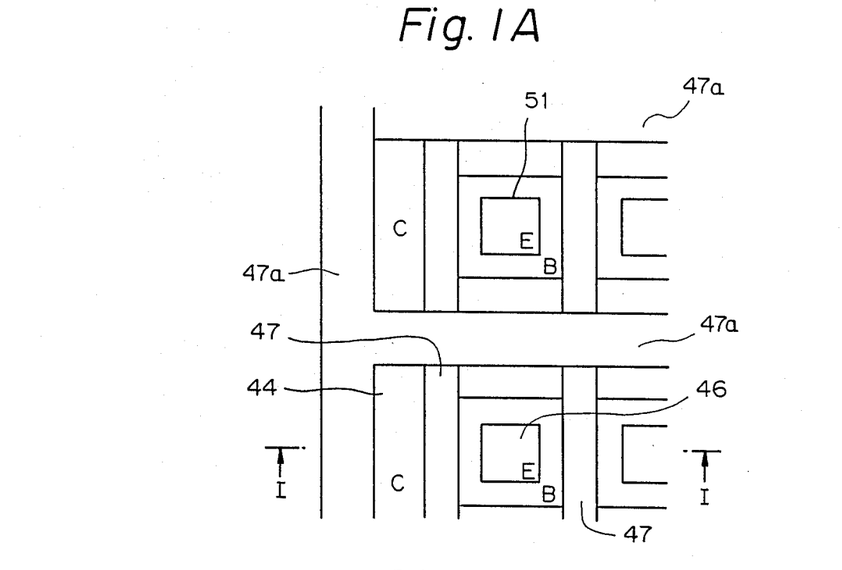
FIGS. 1A and 1B are a plan view of a conventional memory device and a cross-sectional view taken along the line I—I of FIG. IA, respectively.
Figure 1B:
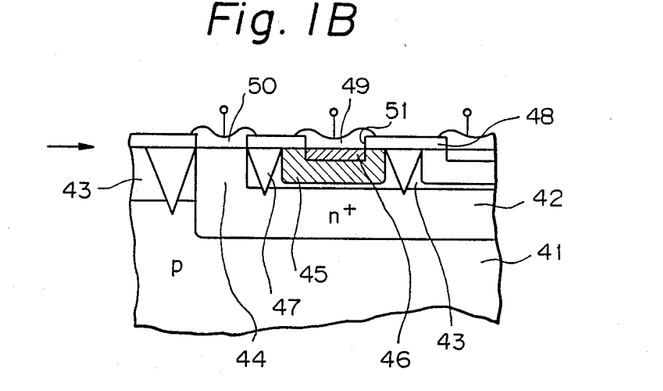

FIGS. 1A and 1B are a plan view of a conventional memory device and a cross-sectional view taken along the line I—I of FIG. 1A respectively.

As shown in FIGS. 1A and 1B, formed on a p-type semiconductor are an n+ type buried layer 42, an n type epitaxial layer 43, a collector contact region 44, a p type base region 45, an n+ type emitter region 46, and a shallower V-shaped insulating isolation region 47, a deeper V-shaped insulating isolation region 47a. Further provided on the above-mentioned structure are an $SiO_2$ film 48, an emitter electrode 49, and a collector electrode 50.

As explained above, a writing operation is carried out by flowing a write current between the emitter electrode connected to the bit line and the collector electrode connected to the word line so that a reverse current flows from an emitter region to a base region for breaking the emitter-base junction. Namely, the writing is performed by flowing the current at the base-emitter junction near the collector contact region 44 in the memory cell area surrounded by the isolating region 47, 47a.

In FIGS. 1A and 1B, the emitter window 51 is independently formed with respect to the V-shaped insulating isolation region 47.

Figure 2:
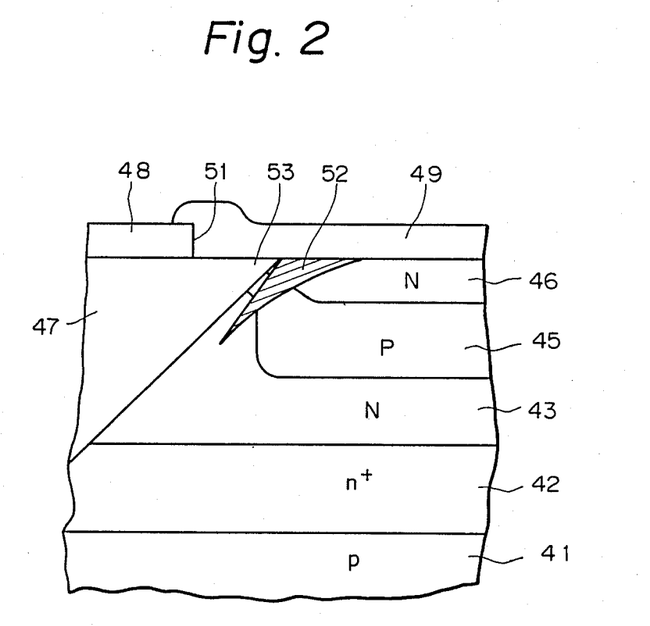
FIG. 2 is a partially enlarged cross-sectional view explaining an emitter-epitaxial region short.
Figure 3A:
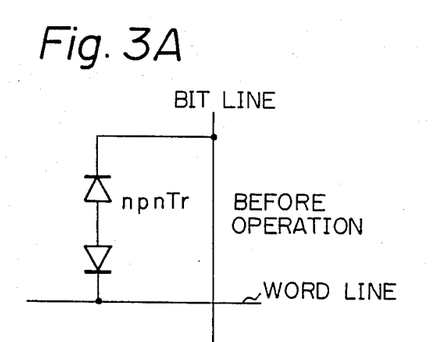
FIGS. 3A to 3C are npn transistor diode matrixes before operation, in normal operation, and in abnormal operation.
Figure 3B:
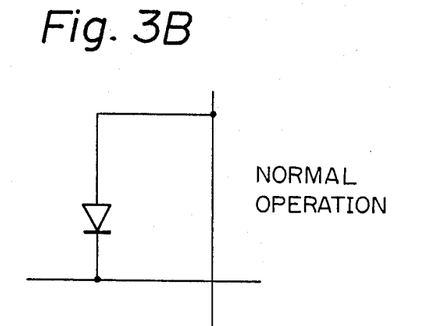
Figure 3C:
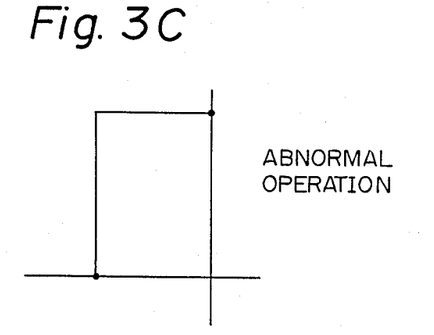

When the emitter window 51 is shifted from a desired position due to a mask alignment error, an emitter-base (EB) junction is brought into contact with a so-called bird's beak 53 of the V-shaped isolation region 47 below the bird's beak as shown in FIG. 2. In case of the EB junction is brought into contact with the bird's beak, when a write current is applied between emitter electrode and collector electrode a eutectic alloy 52 (Al—Si) is produced so as to shorten from the emitter region 46 to the epitaxial layer 43 through the base region 45 so that over-programming i.e., abnormal wiring, occurs and the memory cell is abnormally operated. An abnormal operation is an npn transistor (Tr) diode matrix is shown in FIG. 3C, and a normal writing operation is shown in FIG. 3B. FIG. 3A shows the state before the reverse current flows. When the base and emitter regions are formed by using the same mask of the V-shpae isolation region 47 i.e. a self-alignment process, the same problem as mentioned above occurs, and thus miniaturization of the memory device by the self-alignment process can not be realized.

The present invention will now be explained with reference to FIGS. 4A to 4F, FIGS. 5A and 5B, FIGS. 6A to 6E and FIGS. 7A to 7F.

FIGS. 4A to 4D are cross-section views explaining production steps of an example according to the present invention.

Figure 4A:
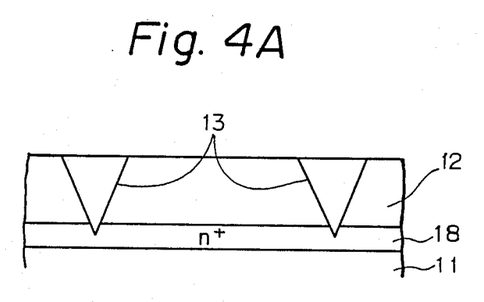
FIGS. 4A to 4D are cross-sectional views explaining production steps of a first example according to the present invention.
Figure 4B:
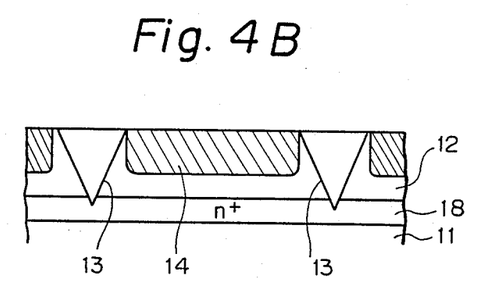
Figure 4C:
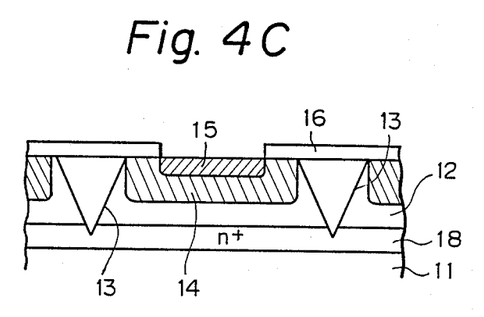
Figure 4D:
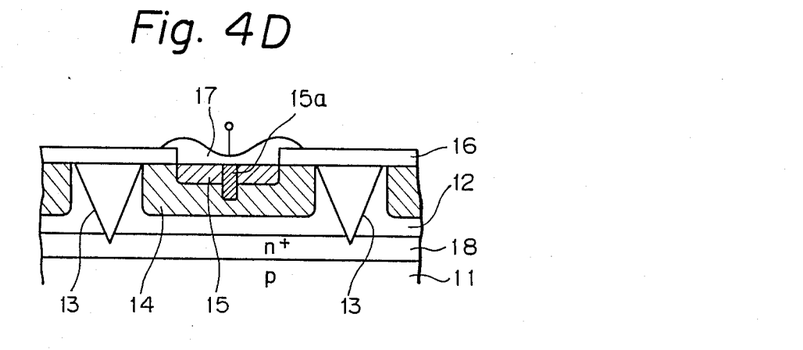

As shown in FIG. 4D, provided in a p-type semiconductor substrate 11 are an n+-type buried layer 18 and an n-type epitaxial layer 12 isolated by a V-shaped insulating isolation regions 13. Provided in the epitaxial layer 12 is a p-type base region 14 and a n-type first emitter region 15.

In such a semiconductor memory cell, an n+-type second emitter region 15a having higher impurity concentration than in the first emitter region 15 is formed in the first emitter region 15 in such manner that the emitter region 15 is penetrated upward and downward at substantially the center portion thereof, and the second emitter region 15a reaches the base region 14. Therefore, when a reverse current flows from the first emitter region 15 to the base region 14, the current is led to pass through the second emitter region 15a having a high concentration and reachs the base region 14 so that information writing is carried out without short from the emitter region to the epitaxial layer or over-programming as mentioned in FIG. 2.

The structure of FIG. 4D is produced by the following process.

As shown in FIG. 4A, formed on the p-type semiconductor substrate 11 are the n+-type buried layer 18, n-type the epitaxial layer 12 as a collector, and the V-shaped insulating isolation region 13 by a usual technique. In the V-shaped region 13, an insulating material, for example, polycrystalline silicon, is formed.

Then, as shown in FIG. 4B, in a region isolated by the V-shaped insulating isolation region 13 having depth of about 4.2μ and width of about 6μ, the base region 14 having depth of about 1.2μ and width of about 10μ is formed by an usual base diffusion process using the V-shaped region 13 as a mask.

Then, as shown in FIG. 4C, in the base region 14 the first emitter region 15 having depth of about 0.36μ and width of about 3μ is formed using an $SiO_2$ layer 16 as a mask.

Then, as shown in FIG. 4D, at substantially the center portion of the first emitter region 15, the second emitter region 15a extending to the interior of base region 14 and having a higher impurity concentration than in the first emitter region 15, is formed by a usual emitter diffusion process. Thus, a memory cell of the present invention is realized. The second emitter region 15a has depth of about 0.5μ and width of about 0.3μ And Al emitter electrode 17 is formed on the emitter region 15.

Figure 4E:
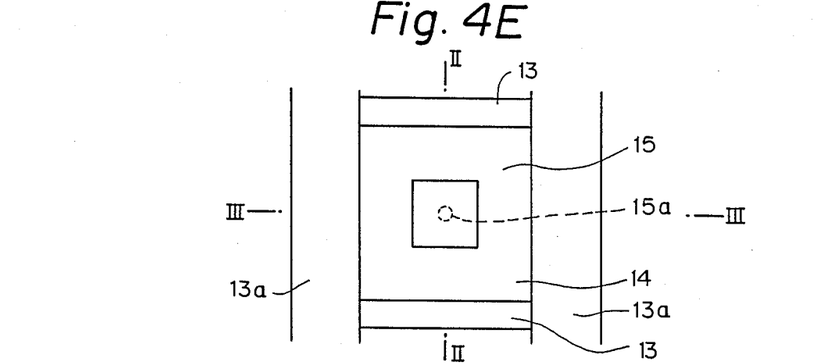

FIG. 4E is a plan view according to FIG. 4D, i.e., FIG. 4D is a cross-sectional view taken along the line II—II of FIG. 4E.

Figure 4F:
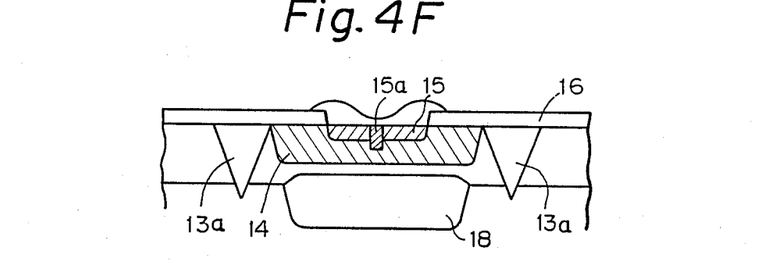
FIG. 4F is a cross-sectional view taken along the line III—III of FIG. 4E.

FIG. 4F is a cross-sectional view taken along the line III—III of FIG. 4E. A deeper V-shape isolation region 13a reaches to the substrate 11. In this embodiment, the width of base region 14 at the second emitter region 15a is about 0.7μ (base is 1.2μ and second emitter region 15a is 0.5μ) which is enough to avoide the abnormal writing, i.e., perretration EB junction and BC junction.

Figure 5A:
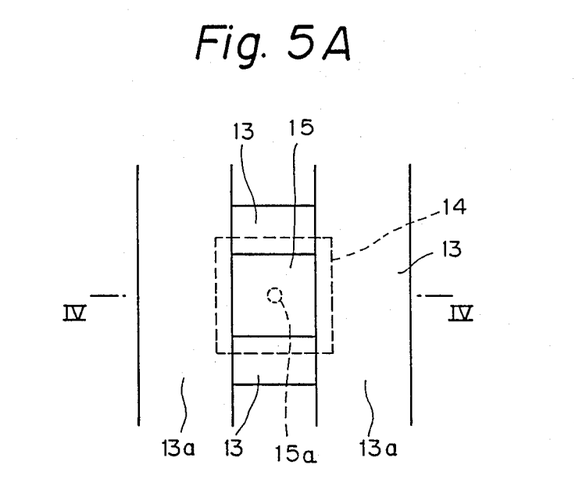
FIGS. 5A and 5B are, respectively, a plan view and a cross-sectional view, taken along the line IV—IV, of an example of the present invention wherein the first example of FIGS. 4A to 4F is produced by an emitter self-alignment process.
Figure 5B:
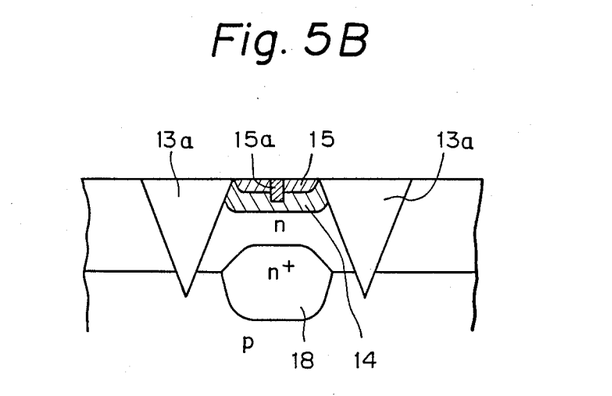

FIGS. 5A and 5B are respectively a plan view and a cross-sectional view thereof of an example of the present invention, wherein the first example of FIGS. 4A to 4F is produced by an emitter self-alignment process.

As shown in FIGS. 5A and 5B, after forming a structure shown in FIG. 4B, an emitter diffusion region 15 is formed using the deepen V-shaped insulating region 13a as a mask. Namely, in this example, the base region 14 and the first emitter region 15 having a width of about 4μ are formed by using the same V-shaped region 13a as a mask. The depth of the base region 14 and the first emiter region 15 are the same as explained in the first example, respectively. Therefore, in this embodiment the emitter self-alignment process can be performed so that the size of the cell is miniaturized. Further, by forming a second emitter region 15a having a high impurity concentration at the center portion of the first emitter region 15, as explained in FIG. 4D, even though the emitter region is formed by using the V-shaped region 13a as a mask, a short or over programming can be prevented so that normal writing can be carried out.

FIGS. 6A to 6D are cross-sectional views explaining production steps of a second example according to the present invention.

Figure 6A:
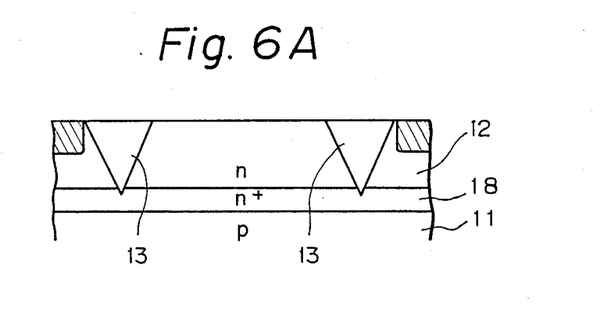
FIGS. 6A to 6D are cross-sectional views explaining production steps of a second example according to the present invention.
Figure 6B:
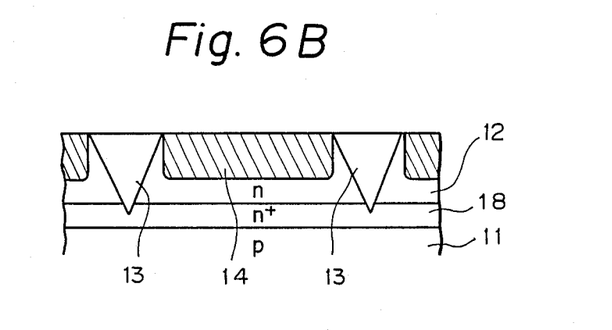
Figure 6C:
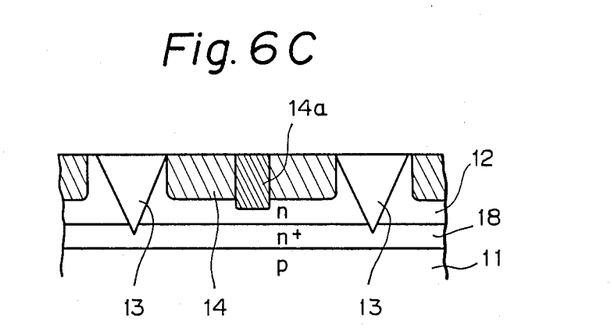
Figure 6D:
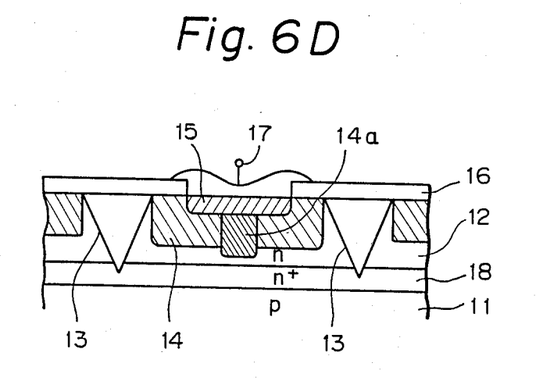

As shown in FIG. 6D, in the first base region 14 a second base region 14a having a higher impurity concentration than in the base region 14 is formed in such a manner that the first base region 14 is penetrated upward and downward at substantially the center portion thereof and the second base region 14a reaches the epitaxial layer 12. Thus the reverse current for writing flows from the emitter region 15 to the epitaxial layer 14 through the second base region 14a concentratedly.

The production process of FIG. 6D is carried out by producing a structure shown in FIGS. 6A and 6B and with the same step as explained in FIGS. 4A and FIG. 4B, and forming a second base region having a higher impurity concentration than in the first base region 14 at substantially the center of the base region 14 by a well known base diffusion process, so that it reaches the epitaxial layer 12. Then, as shown in FIG. 6D, an emitter region 15 and an emitter electrode 17 are formed.

Figure 6E:
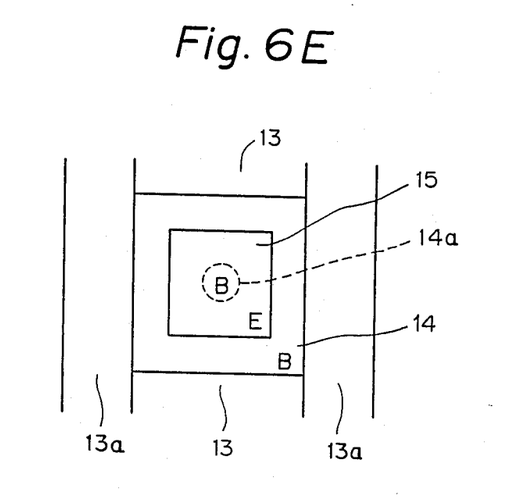
FIG. 6E is a schematic plan view of FIG. 6E.

FIG. 6E is a plan view of FIG. 6D. In the second example, the emitter self-alignment process miniaturization can be also used in the same way as in the first example of the present invention in FIGS. 5A, 5B.

Figure 7A:
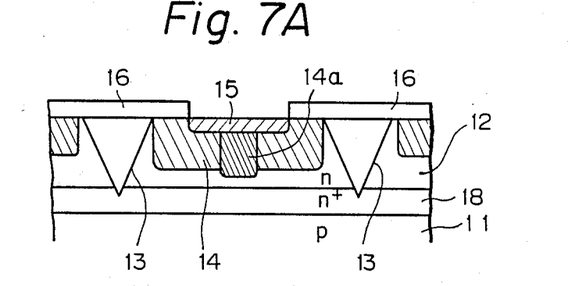
FIGS. 7A and 7B are cross-sectional views explaining production steps of a third example according to the present invention.
Figure 7B:
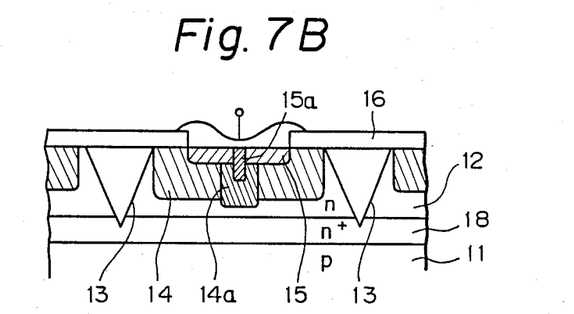
Figure 7C:
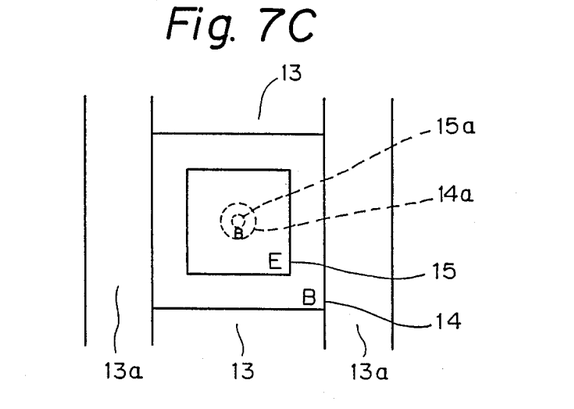
FIG. 7C is a schematic plan view of FIG. 7B.

FIGS. 7A and 7B are cross-sectional views explaining production steps of a third example according to the present invention. FIG. 7C is a schematic plan view of FIG. 7B.

After forming a structure shown in FIG. 7A, which is produced by the same steps as shown in the second example, a second emitter region 15a is extended into the second base region 14 through the first emitter region 15 at the center portion thereof. The n+-type second emitter region has a higher impurity concentration than that of the first emitter region 15. In the third example, a current for program writing is led to flow from the first emitter region 15 to the second base region 14a. The emitter self-alignment process can be alsso used miniaturization in this third example, as explained above.

As explained above, according to the present invention, in case where the emitter region is formed by using a different narrower window mask than the V-shaped isolation region, eventhough there is a mask alignment error so that the emitter-base junction and the base width becomes small at the side wall, shown in FIG. 2, the write current flows concentratedly through, the higher impurity concentration region 15a or 14a. Therefore there is no abnormal write operation in which EB junction and BC junction is broken at the side wall of the V-shaped region.

In case of self-alignment process is used for forming the emitter region, eventhough the base width becomes narrow at the side wall of V-shaped region, the write current flows concentratedly at the central region of the memory cell.

We claim:

1. A semiconductor memory device using a junction short type programmable element comprising:
an epitaxial layer formed on a semiconductor substrate, said epitaxial layer having an opposite conductive type to that of the semiconductor substrate, said epitaxial layer being a collector region;
a base region having the same conductive type as the substrate formed in the epitaxial layer,
a first emitter region having an opposite conductive type to that of the base region, formed in the base region,
an insulating isolation region, formed in said epitaxial layer and around the base region,
a second emitter region having a higher impurity concentration than that of said first emitter region and the same conductive type as that of the first emitter region, formed at a bottom portion of the first emitter region in such a manner that said second emitter region extends to the interior of the base region, so that a writing current flows concentratedly at the second emitter region.

2. A semiconductor memory device according to claim 1, wherein the base region is defined by the insulating isolation region and the first emitter region is defined by a smaller insulating layer window than the insulating isolation region, positioned inside the insulating isolation region.

3. A semiconductor memory device according to claim 1, wherein said first emitter region and the second emitter region have an impurity concentration of $1\times 10^{18}$ to $1\times 10^{19}/cm^3$ and $1\times 10^{20}$ to $1\times 10^{21}/cm^3$ respectively.

4. A semiconductor memory device according to claim 1, wherein the base region has a width of about $10\mu$ and depth of about $1.2\mu$, the first emitter region has a width of about $3\mu$ and depth of $0.36\mu$, and the second emitter region has a width of about $0.3\mu$ and depth of $0.5\mu$.

5. A semiconductor memory device according to claim 1, wherein the base region and the first emitter region are defined by the insulating isolation region.

6. A semiconductor memory device according to claim 1, wherein the base region and the first emitter region have the same width of about $4\mu$.

7. A semiconductor memory device using a junction short type programmable element comprising:
an epitaxial layer formed on a semiconductor substrate, said epitaxial layer having an opposite conductive type to that of the semiconductor substrate, said epitaxial layer being a collector region;
a first base region having the same conductive type formed in the epitaxial layer,
an emitter region is having an opposite conductive type to that of the base region, formed in the base region,
an insulating isolation region, formed in the epitaxial layer and around the base region,
a second base region having a higher impurity concentration than that of said first base region and having the same conductive type as that of the first base region, formed at a bottom portion of the first base region in such a manner that said second base region extends to the interior of the collector region, so that a writing current flows concentratedly at the second base region.

8. A semiconductor memory device according to claim 7, wherein the base region is defined by the insulating isolation region and the first emitter region is defined by a smaller insulating layer window than the insulating isolation region, positioned inside the insulating isolation region.

9. A semiconductor memory device according to claim 7, wherein the base region and the emitter region are defined by the insulating isolation region.

10. A semiconductor memory device using a junction short type programmable element comprising:
- an expitaxial layer formed on a semiconductor substrate, said epitaxial layer having an opposite conductive type to that of the semiconductor substrate, said epitaxial layer being a collector region;
- a first base region having the same conductive type as the substrate formed in the epitaxial layer;
- a first emitter region having an opposite conductive type to that of the base region, formed in the first base region;
- an insulating isolation region, formed in said epitaxial layer and around the first base region;
- a second base region having a higher impurity concentration than that of said first base region and having the same conductive type as that of the first base region, formed at a bottom portion of the first base region in such a manner that said second base region extends to the interior of the collector region; and
- a second emitter region having a higher impurity concentration than that of said first emitter region and having the same conductive type as that of the first emitter region, formed in the first emitter region in such a manner that said second emitter region extends to an interior of the second base region so that a writing current flows concentratedly at the second emitter region.

11. A semiconductor memory device according to claim 10, wherein the base region is defined by the insulating isolating isolation region and the first emitter region is defined by a smaller insulating layer window than the insulating isolation region, positioned inside the insulating isolation region.

12. A semiconductor memory device according to claim 10, wherein the base region and the first emitter region are defined by the insulating isolation region.

* * * * *